United States Patent
Kim et al.

(10) Patent No.: US 10,038,476 B2
(45) Date of Patent: Jul. 31, 2018

(54) APPARATUS AND METHOD FOR COMMUNICATION USING WIRELESS POWER

(71) Applicant: SAMSUNG ELECTRONICS CO., LTD., Suwon-si (KR)

(72) Inventors: Nam Yun Kim, Seoul (KR); Sang Wook Kwon, Seongnam-si (KR); Yun Kwon Park, Dongducheon-si (KR); Eun Seok Park, Yongin-si (KR); Young Tack Hong, Seongnam-si (KR); Ki Young Kim, Yongin-si (KR); Young Ho Ryu, Yongin-si (KR); Dong Zo Kim, Yongin-si (KR); Jin Sung Choi, Gimpo-si (KR); Chang Wook Yoon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 301 days.

(21) Appl. No.: 14/929,811

(22) Filed: Nov. 2, 2015

(65) Prior Publication Data

US 2016/0080040 A1    Mar. 17, 2016

Related U.S. Application Data

(63) Continuation of application No. 13/483,347, filed on May 30, 2012, now Pat. No. 9,178,568.

(30) Foreign Application Priority Data

May 31, 2011    (KR) .................. 10-2011-0052180

(51) Int. Cl.
*H01F 27/42* (2006.01)
*H01F 37/00* (2006.01)
(Continued)

(52) U.S. Cl.
CPC ............ *H04B 5/0037* (2013.01); *H02M 7/04* (2013.01); *H03F 3/04* (2013.01); *H04B 5/0031* (2013.01); *H04B 5/0081* (2013.01)

(58) Field of Classification Search
CPC .... H04B 5/0031; H04B 5/0037; H04B 5/008; H02M 7/04; H03F 3/04
See application file for complete search history.

(56) References Cited

U.S. PATENT DOCUMENTS 5,345,231 A    9/1994 Koo et al.
5,455,467 A    10/1995 Young et al.
(Continued)

FOREIGN PATENT DOCUMENTS

JP    2008-206325 A    9/2008
JP    2010-88143 A    4/2010
(Continued)

*Primary Examiner* — Jared Fureman
*Assistant Examiner* — Esayas Yeshaw
(74) *Attorney, Agent, or Firm* — NSIP Law

(57) ABSTRACT

An apparatus and method for communication using a wireless power are provided. The apparatus includes an amplifier configured to amplify an input signal based on a power supplied to the amplifier. The apparatus further includes a control unit configured to detect a change in an impedance of a target device, and to change the power based on the change in the impedance. The apparatus further includes a demodulation unit configured to receive a message from the target device, and to demodulate the message based on the changed power.

16 Claims, 18 Drawing Sheets

(51) Int. Cl.
   *H01F 38/00*      (2006.01)
   *H04B 5/00*       (2006.01)
   *H02M 7/04*       (2006.01)
   *H03F 3/04*       (2006.01)

(56) References Cited

U.S. PATENT DOCUMENTS

| | | | |
|---|---|---|---|
| 5,862,458 A | 1/1999 | Ishii | |
| 8,412,963 B2* | 4/2013 | Tsai | G06F 1/266 307/104 |
| 2008/0231120 A1* | 9/2008 | Jin | H02J 5/005 307/104 |
| 2009/0322280 A1* | 12/2009 | Kamijo | H02J 7/025 320/108 |
| 2010/0034238 A1* | 2/2010 | Bennett | H02J 5/005 375/130 |
| 2010/0036773 A1* | 2/2010 | Bennett | G06Q 20/3674 705/67 |
| 2010/0176923 A1 | 7/2010 | Tu | |
| 2010/0217553 A1* | 8/2010 | Von Novak | G06K 7/0008 702/65 |
| 2010/0270867 A1* | 10/2010 | Abe | H02J 7/025 307/104 |
| 2011/0081857 A1 | 4/2011 | Lee et al. | |
| 2011/0115303 A1 | 5/2011 | Baarman et al. | |
| 2011/0156640 A1* | 6/2011 | Moshfeghi | H02J 7/025 320/108 |
| 2012/0309304 A1 | 12/2012 | Kim et al. | |

FOREIGN PATENT DOCUMENTS

| | | |
|---|---|---|
| KR | 10-2011-0009227 A | 1/2011 |
| KR | 10-2011-0010105 A | 1/2011 |

* cited by examiner

APPARATUS AND METHOD FOR COMMUNICATION USING WIRELESS POWER

CROSS-REFERENCE TO RELATED APPLICATION(S)

This application is a continuation of U.S. patent application Ser. No. 13/483,347 filed on May 30, 2012, which claims the benefit under 35 U.S.C. § 119(a) of Korean Patent Application No. 10-2011-0052180, filed on May 31, 2011, in the Korean Intellectual Property Office, the entire disclosure of which is incorporated herein by reference for all purposes.

BACKGROUND

1. Field

The following description relates to an apparatus and method for communication using a wireless power.

2. Description of Related Art

Wireless power transmission may overcome problems, such as, for example, the inconvenience of wired power supplies, and limits to existing battery capacities, with respect to various electronic devices including, for example, electric vehicles, mobile devices, and/or the like. Wireless power transmission may use resonance characteristics of radio frequency (RF) elements. For example, a wireless power transmission system using resonance characteristics may include a source device configured to supply power, and a target device configured to receive the supplied power.

SUMMARY

In one general aspect, there is provided an apparatus for communication using a wireless power, including an amplifier configured to amplify an input signal based on a power supplied to the amplifier. The apparatus further includes a control unit configured to detect a change in an impedance of a target device, and to change the power based on the change in the impedance. The apparatus further includes a demodulation unit configured to receive a message from the target device, and to demodulate the message based on the changed power.

The apparatus further includes a detection unit configured to detect the changed power.

The detection unit further includes a resistor, or an ON-resistance of a transistor, or a line impedance, or any combination thereof. The detection unit is further configured to detect a voltage applied to the resistor, or the ON-resistance of a transistor, or the line impedance, or any combination thereof, to detect the changed power.

The demodulation unit includes an amplification unit configured to amplify the changed power to be greater than a predetermined value.

The demodulation unit includes a ripple signal removing unit configured to remove a ripple signal included in the changed power.

The demodulation unit includes a comparison unit configured to compare the changed power to a predetermined reference signal, and to determine a HIGH value or a LOW value of the changed power based on a result of the comparison. The demodulation unit is further configured to demodulate the message based on the HIGH value or the LOW value.

In another general aspect, there is provided an apparatus for communication using a wireless power, including an amplifier configured to amplify an input signal based on a direct current (DC) voltage of a plurality of levels that is supplied to the amplifier. The apparatus further includes a control unit configured to control the DC voltage. The apparatus further includes a modulation unit configured to modulate data based on the controlled DC voltage.

The apparatus further includes a conversion unit configured to receive an alternating current (AC) voltage, and to convert the AC voltage to the DC voltage based on a switching pulse signal.

The amplifier is further configured to output a power based on the amplified signal. The modulation unit is further configured to modulate the data based on an index of the power.

The control unit is further configured to generate a digital control signal, to convert the digital control signal to an analog control signal, and to control the DC voltage based on the analog control signal.

The control unit is further configured to control a pulse width of the DC voltage.

The amplifier is further configured to receive an input voltage and an operational voltage. The control unit is further configured to control a magnitude of the input voltage or a magnitude of the operational voltage.

In still another general aspect, there is provided a method for communication using a wireless power, including detecting a change in an impedance of a target device. The method further includes changing a power supplied to an amplifier based on the change in the impedance. The method further includes demodulating a message received from the target device based on the changed power.

The method further includes detecting the changed power.

The demodulating includes amplifying the changed power to be greater than a predetermined value.

The demodulating includes comparing the changed power to a predetermined level, determining a HIGH value or a LOW value of the changed power based on a result of the comparing, and demodulating the message based on the HIGH value or the LOW value.

In yet another general aspect, there is provided a method for communication using a wireless power, including controlling a direct current (DC) voltage of a plurality of levels that is supplied to an amplifier. The method further includes modulating data based on the controlled DC voltage.

The method further includes converting an alternating current (AC) voltage to the DC voltage based on a switching pulse signal.

The modulating includes modulating the data based on an index of a power output from the amplifier.

The controlling includes generating a digital control signal, converting the digital control signal to an analog control signal, and controlling the DC voltage based on the analog control signal.

The controlling includes controlling a pulse width of the DC voltage.

Other features and aspects may be apparent from the following detailed description, the drawings, and the claims.

Figure 1:
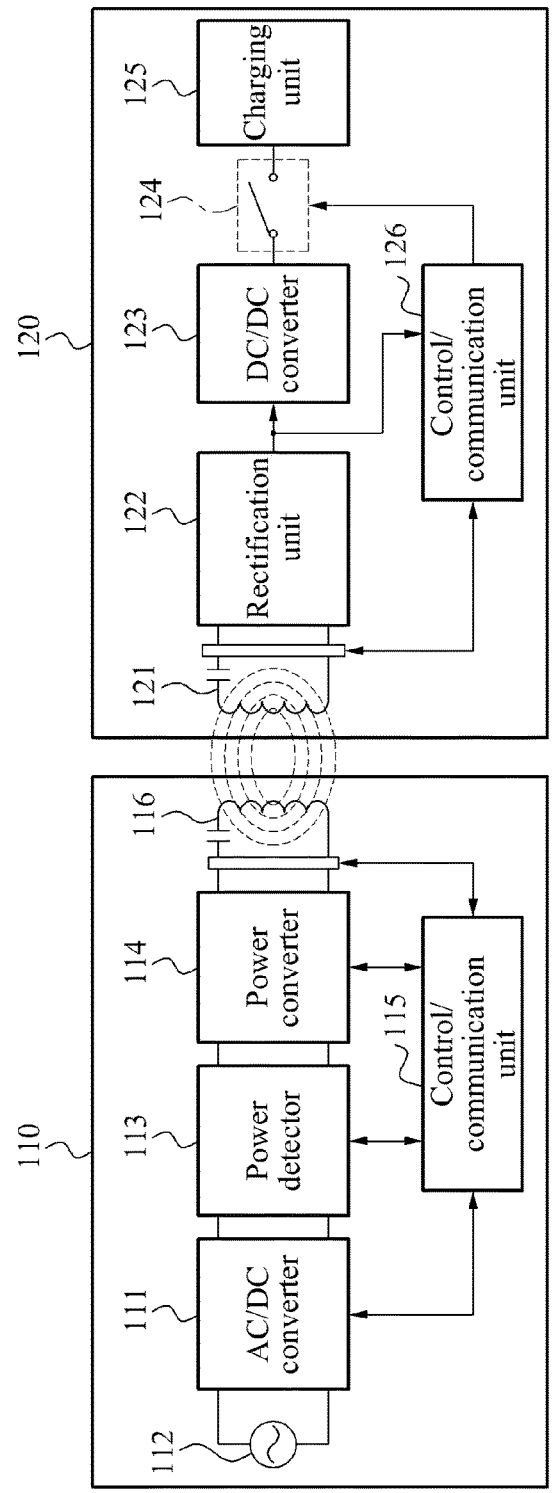
FIG. 1 is a diagram illustrating an example of a wireless power transmission system.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 illustrates an example of a wireless power transmission system. The wireless power transmission system includes a source device 110 and a target device 120. The source device 110 includes a device supplying a wireless power, and may include all sorts of electric devices that supply a power, such as, for example, pads, terminals, televisions (TV's), and/or other types of devices. The target device 120 includes a device receiving a wireless power, and may include an all sorts of electronic devices that consume a power, such as terminals, TV's, vehicles, washing machines, radios, lighting systems, and/or other types of devices.

The source device 110 includes an alternating current-to-direct current (AC/DC) converter 111, a power supply 112, a power detector 113, a power converter 114, a control and communication (control/communication) unit 115, and a source resonator 116. The target device 120 includes a target resonator 121, a rectification unit 122, a DC-to-DC (DC/DC) converter 123, a switch unit 124, a charging unit 125, and a control/communication unit 126.

The AC/DC converter 111 rectifies an AC voltage output from the power supply 112 to generate a DC voltage. The AC/DC converter 111 may output the DC voltage of a predetermined level, or may adjust an output level of the DC voltage, based on control of the control/communication unit 115.

The power detector 113 detects an output current and an output voltage of the AC/DC converter 111, and transfers, to the control/communication unit 115, information on the detected current and the detected voltage. The power detector 113 may detect an input current and an input voltage of the power converter 114.

The power converter 114 converts the DC voltage to an AC voltage to generate a power, using a switching pulse signal in a band of a few megahertz (MHz) to tens of MHz. The power converter 114 converts the DC voltage to the AC voltage using a resonance frequency, and thus, generates a communication power to be used for communication and/or a charging power to be used to charge in the target device 120. For example, the communication power may correspond to energy to activate a processor and a communication module of the target device 120. Further, the communication power may be referred to as a wake-up power. The communication power may be transmitted in a form of a constant wave during a predetermined time. In another example, the charging power may correspond to energy to charge a battery connected to or included in the target device 120. Further, the charging power may be continuously transmitted during a predetermined time, and may be transmitted at a power level greater than a power level of the communication power.

The control/communication unit 115 controls the resonance frequency of the switching pulse signal. That is, the resonance frequency of the switching pulse signal is determined based on the control of the control/communication unit 115. By controlling the power converter 114, the control/communication unit 115 generates a modulated signal to be transmitted to the target device 120. The control/communication unit 115 may transmit various messages to the target device 120 through an in-band communication. The control/communication unit 115 detects a reflected wave, and demodulates a signal received from the target device 120 through an envelope of the detected reflected wave.

The control/communication unit 115 may generate the modulated signal for the in-band communication, using various schemes. For example, to generate the modulated signal, the control/communication unit 115 may turn the switching pulse signal ON and OFF, or may perform delta-sigma modulation. Additionally, the control/communication unit 115 may generate a pulse-width modulated (PWM) signal having a predetermined envelope.

The control/communication unit 115 may perform an out-band communication using a communication channel, as opposed to using the resonance frequency. The control/communication unit 115 may include a communication module, such as, for example, a ZigBee module, a Bluetooth module, and other types of modules. The control/communication unit 115 may perform transmission and reception of data with the target device 120 through the out-band communication.

The source resonator 116 transfers an electromagnetic energy to the target resonator 121. For example, the source resonator 116 transfers, to the target device 120, the communication power and/or the charging power through a magnetic coupling with the target resonator 121.

The target resonator 121 receives the electromagnetic energy from the source resonator 116. For example, the target resonator 121 receives, from the source device 110, the communication power and/or the charging power through a magnetic coupling with the source resonator 116. The target resonator 121 may receive various messages from the source device 110 through the in-band communication.

The rectification unit 122 rectifies an AC voltage received from the target resonator 121 to generate a DC voltage The DC/DC converter 123 adjusts a level of the DC voltage output from the rectification unit 122 based on a capacity of the charging unit 125. For example, the DC/DC converter 123 may adjust the level of the DC voltage to be within a range of 3 Volts (V) to 10V.

The switch unit 124 is turned ON and OFF based on a control of the control/communication unit 126. When the switch unit 124 is turned OFF, the control/communication 115 of the source device 110 detects the reflected wave. When the switch unit 124 is turned OFF, the magnetic coupling between the source resonator 116 and the target resonator 121 is eliminated.

The charging unit 125 may include a battery. The charging unit 125 may charge the battery using the DC voltage output from the DC/DC converter 123.

The control/communication unit 126 may perform the in-band communication to transmit and receive data using the resonance frequency. In this example, the control/communication unit 126 may demodulate a received signal by detecting a signal between the target resonator 121 and the rectification unit 122, or by detecting an output signal of the rectification unit 122. The control/communication unit 126 may demodulate a message received through the in-band communication. Also, the control/communication unit 126 may adjust an impedance of the target resonator 121 to modulate a signal to be transmitted to the source device 110. The control/communication unit 126 may turn the switch unit 124 ON and OFF to modulate the signal to be transmitted to the source device 110. For example, the control/communication unit 126 may increase the impedance of the target resonator 121 so that the control/communication unit 115 of the source device 110 detects the reflected wave. In this example, depending on whether the reflected wave is detected, the control/communication unit 115 may detect a binary value of "0" or "1".

The control/communication unit 126 may perform the out-band communication using the communication channel. The control/communication unit 126 may include, for example, a communication module, such as a ZigBee module, a Bluetooth module, and/or other types of modules. The control/communication 126 may perform transmission and reception of data with the source device 110 through the out-band communication.

Figure 2:
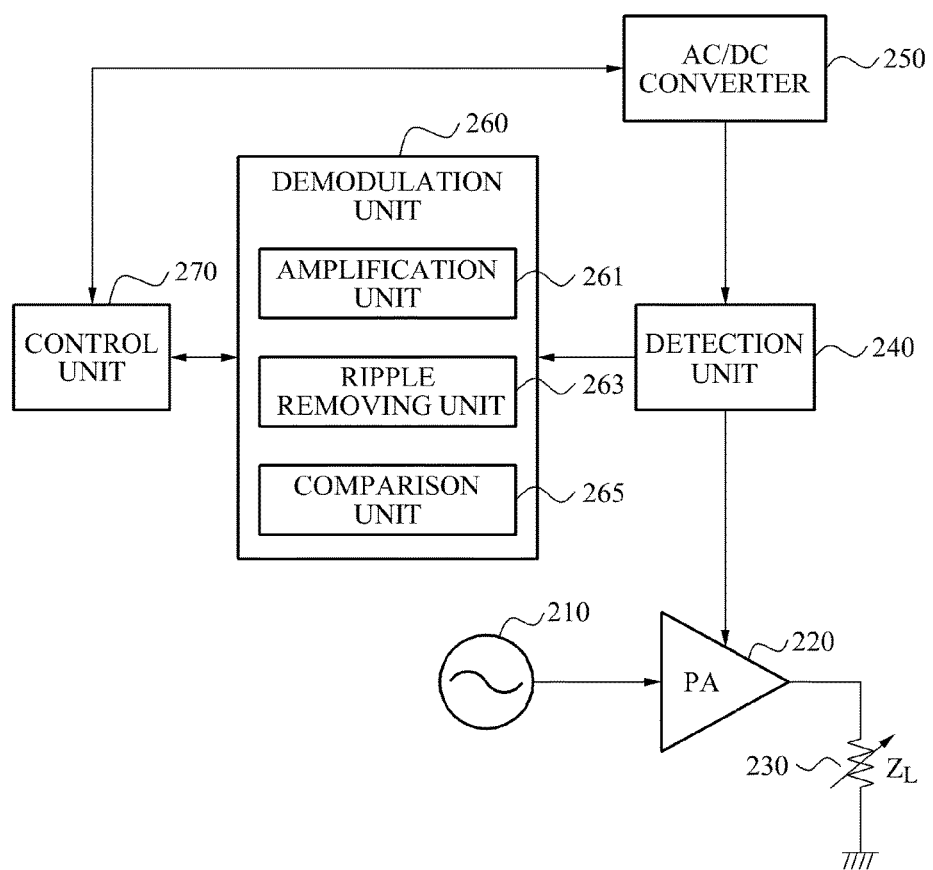
FIG. 2 is a diagram illustrating an example of a communication apparatus using a wireless power.

FIG. 2 illustrates an example of a communication apparatus using a wireless power. The communication apparatus may be implemented in the source device 110 of FIG. 1. Referring to FIG. 2, the communication apparatus includes a frequency generating unit 210, a power amplifier (PA) 220, a detection unit 240, an AC/DC converter 250, a demodulation unit 260, and a control unit 270.

The frequency generating unit 210 generates a signal with a resonance frequency. The resonance frequency is determined by the control unit 270. To determine the resonance frequency, the control unit 270 matches impedances between a source device and a target device.

The PA 220 amplifies the input signal with the resonance frequency to a magnitude (e.g., of amplitude) corresponding to a request of the target device. The request of the target device may be determined based on an impedance 230 of the target device. The impedance 230 of the target device includes an impedance viewed from a direction of the source device to the target device. Also, a power corresponding to the request of the target device may be determined based on a power supplied to the PA 220 from the AC/DC converter 250. An amount of the power supplied to the PA 220 may be calculated by measuring a supplied voltage or a supplied current.

A process in which the target device modulates a message by changing an impedance of the target device may be referred to as load modulation. When the impedance 230 of the target device is changed, the power supplied to the PA 220 is changed based on the change in the impedance 230. Accordingly, the change in the impedance 230 of the target device may be estimated by measuring the supplied voltage or the supplied current.

For example, the detection unit 240 detects the power supplied to the PA 220. In this example, the detection unit 240 may detect the voltage or the current supplied to the PA 220. In the following descriptions, a detected supplied power may refer to a detected supplied voltage or a detected supplied current.

In other examples, the detection unit 240 may detect the power supplied to the PA 220 by detecting a voltage applied to both ends of a resistor. The detection unit 240 may detect the power supplied to the PA 220, by detecting a current flowing through the resistor. Also, the detection unit 240 may detect the power supplied to the PA 220, by detecting a voltage applied to both ends of an On-resistance ($R_{on}$) of a transistor. The detection unit 240 may detect the power supplied to the PA 220, by detecting a current flowing through the On-resistance. Further, the detection unit 240 may detect the power supplied to the PA 220, by detecting a voltage applied to both ends of a line impedance. The detection unit 240 may detect the power supplied to the PA 220, by detecting a current flowing through the line impedance.

The AC/DC converter 250 generates the power supplied to the PA 220. To generate the power, the AC/DC converter 250 rectifies an AC signal from, e.g., a power supply, to convert the AC signal to a predetermined DC signal. When the impedance 230 of the target device is changed, the control unit 270 senses the changed impedance, and controls a matching network of the source device to match the impedance of the source device to the changed impedance. Also, the control unit 270 controls the power that is output from the AC/DC converter 250 to be a power corresponding to the request of the target device. The power output from the AC/DC converter 250 is provided to the PA 220 as the supplied power to the PA 220.

The demodulation unit 260 demodulates a message received from the target device based on a change in an amount of the detected supplied power. Since the power supplied to the PA 220 is changed based on the change in the impedance 230 of the target device, the demodulation unit 260 demodulates the message by comparing the change in the amount (e.g., a signal) of the detected supplied power to a predetermined reference signal.

In more detail, the demodulation unit 260 includes an amplification unit 261, a ripple removing unit 263, and a comparison unit 265. The amplification unit 261 amplifies the detected supplied power to be greater than a predetermined value. The amplification unit 261 amplifies the detected supplied power so that the demodulation unit 260 may demodulate the message based on the detected supplied power, even though a value of a resistance of the detection unit 240 is relatively small. For example, the signal of the detected supplied power may have a low amplitude. In order to identify a HIGH value or a LOW value of the detected supplied power, and demodulate the message based on the identified value, a magnitude of amplitude of the detected supplied power may need to be amplified to be greater than the predetermined value. For example, the HIGH value or the LOW value may be determined by comparing the detected supplied power and the reference power. When the detected supplied power is greater than the reference power, the HIGH value may be determined, and otherwise the LOW value may be determined. The reference power may be determined based on the various applications.

The ripple removing unit 263 removes a ripple signal included in the detected supplied power. The ripple signal may be generated when a signal passes through a circuit.

The comparison unit 265 compares the signal of the detected supplied power to the predetermined reference signal to output the HIGH value or the LOW value of the detected supplied power. For example, when the signal of the detected supplied power is greater than the predetermined reference signal, the comparison unit 265 may output the HIGH value, and otherwise, the comparison unit 265 may output the LOW value. The predetermined reference signal may be provided by the control unit 270. The predetermined reference signal may include a predetermined fixed value, or may include a smallest value in the detected supplied power, which may be variable based on the change in the amount of the detected supplied power. The demodulation unit 260 demodulates the message received from the target device based on the HIGH value or the LOW value of the detected supplied power that is output from the comparison unit 265.

The control unit 270 senses the change in the impedance 230 of the target device. For example, the control unit 270 may sense the change in the impedance 230 of the target device through matching networks of the source device and the target device, being improperly matched. Also, the control unit 270 controls the power supplied to the PA 220 based on the change in the impedance 230 of the target device.

Figure 3:
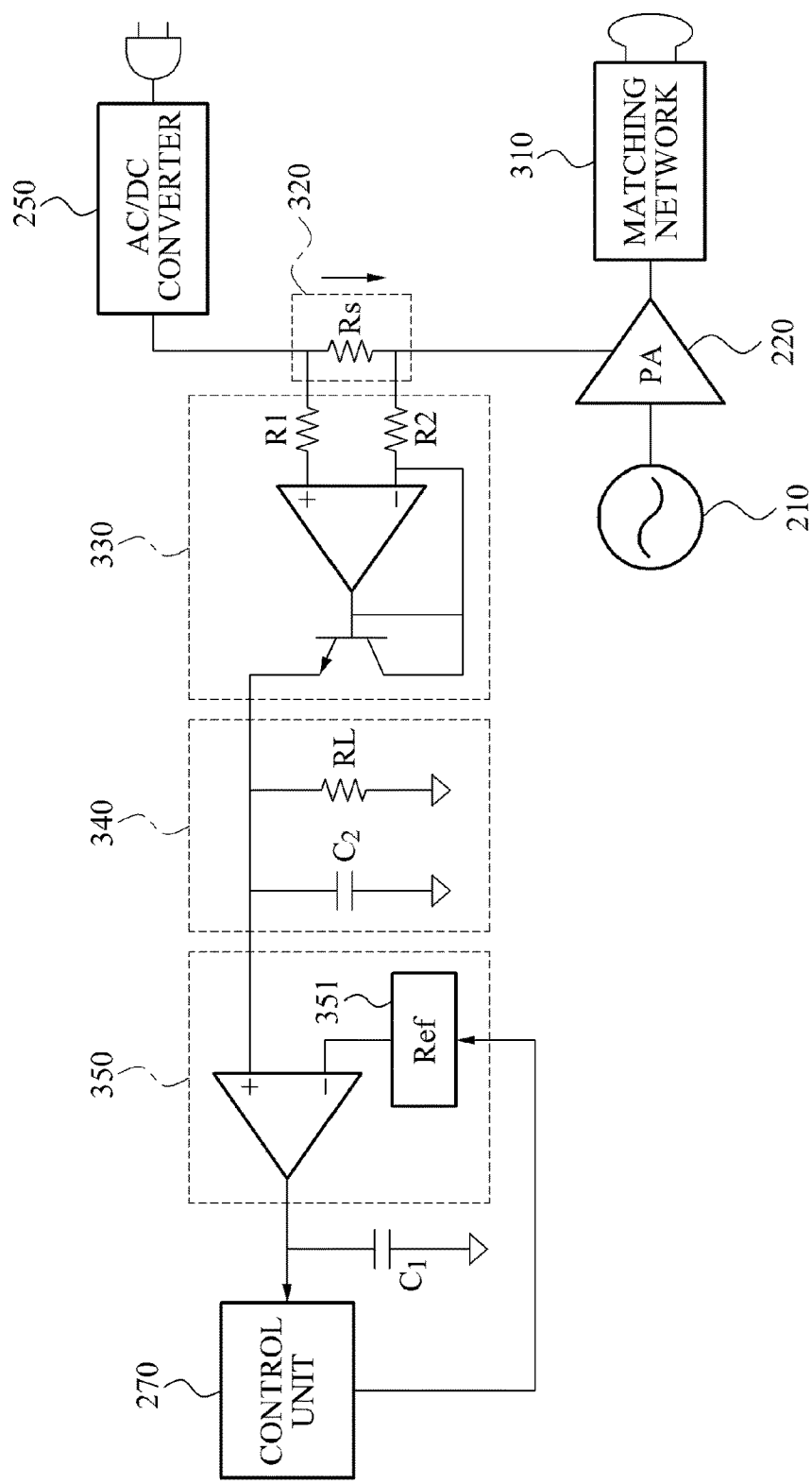
FIG. 3 is a diagram illustrating a detailed example of a communication apparatus using a wireless power.

FIG. 3 illustrates a detailed example of a communication apparatus using a wireless power. The communication apparatus may be implemented in the source device 110 of FIG. 1. The communication apparatus includes a matching network 310, a detection unit 320, an amplification unit 330, a ripple removing unit 340, and a comparison unit 350, along with the the frequency generating unit 210, the PA 220, the AC/DC converter 250, and the control unit 270 of FIG. 2.

Referring to FIG. 3, the matching network 310 matches an input impedance of a target device and an impedance output from the PA 220. The input impedance is changed when an impedance of the target device is changed.

In examples, the detection unit 320 may detect a voltage applied to both ends of a resistor Rs to detect a supplied voltage that is input into the PA 220. A level of a power input into the PA 220 may be determined based on the supplied voltage. A transistor may be used instead of the resistor Rs, and the detection unit 320 may detect a voltage applied to both ends of an On-resistance ($R_{on}$) of the transistor to detect the supplied voltage. The detection unit 320 may detect the supplied voltage using a line impedance instead of the resistor Rs. Also, the detection unit 320 may detect a current flowing through the resistor Rs to detect a supplied current that is input into the PA 220.

The amplification unit 330 amplifies the voltage applied to the both ends of, e.g., the resistor Rs, to be greater than a predetermined value. For example, the amplification unit 330 includes resistors R1 and R2, a differential amplifier and one or more various transistors, which are well-known in the same technical field.

The ripple removing unit 340 removes a ripple signal included in the amplified voltage, using a capacitor $C_2$ and a resistor RL. The comparison unit 350 compares the voltage received from the ripple removing unit 340 to a predetermined reference signal 351, to output a HIGH value or a LOW value of the received voltage. The predetermined reference signal 351 may be provided by the control unit 270. The predetermined reference signal 351 may include a predetermined fixed value, or may include a minimum value of the detected supplied voltage. The comparison unit 350 includes a comparator to perform the comparison.

A capacitor $C_1$ removes a ripple signal included in a signal that is output from the comparison unit 350. The control unit 270 (and/or the demodulation unit 260 of FIG. 2) demodulates a message received from the target device based on the HIGH value or the LOW value that is output from the comparison unit 350.

Figure 4:
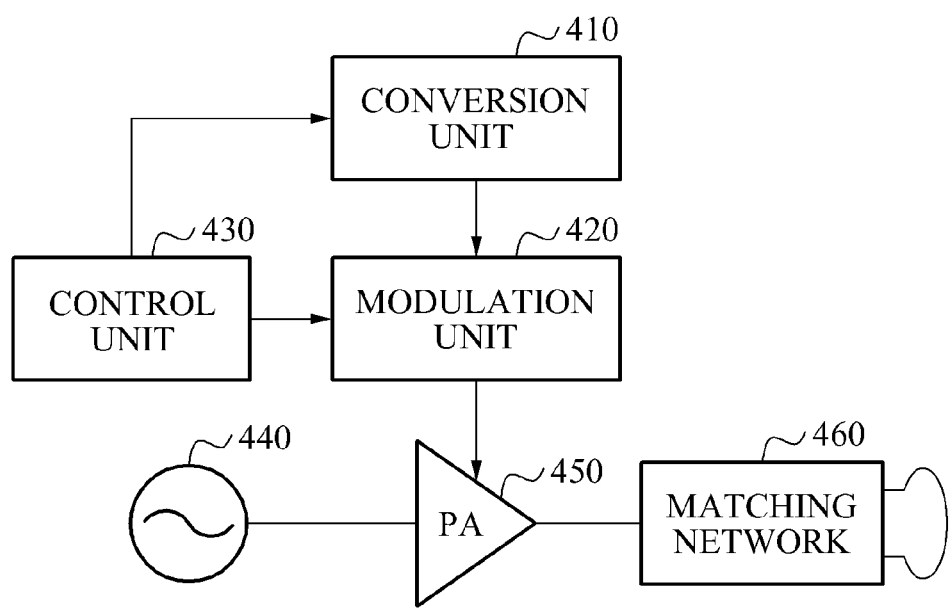
FIG. 4 is a diagram illustrating another example of a communication apparatus using a wireless power.

FIG. 4 illustrates another example of a communication apparatus using a wireless power. The communication apparatus may be implemented in the source device 110 of FIG. 1. Referring to FIG. 4, the communication apparatus includes a conversion unit 410, a modulation unit 420, a control unit 430, a frequency generating unit 440, a PA 450, and a matching network 460.

In examples, the conversion unit 410 may convert an AC voltage to a DC voltage of a plurality of levels, using a switching pulse signal. The AC voltage may be supplied from, for example, an external power supply. The conversion unit 410 may convert the AC voltage to the DC voltage, using a switching mode power supply (SMPS).

The control unit 430 controls the DC voltage of the plurality of levels. For example, the control unit 430 may control a duration and/or a magnitude (e.g., of amplitude) of the DC voltage.

In another example, the control unit 430 may generate a digital control signal and convert the digital control signal to an analog control signal to control the DC voltage of the plurality of levels. In this example, the control unit 430 may include a digital-to-analog (D/A) converter (not shown). The D/A converter may convert the digital control signal to the analog control signal. The control unit 430 may control the magnitude of the DC voltage based on the analog control signal. For example, when a magnitude of the analog control signal is multiplied by the magnitude of the DC voltage, the magnitude of the DC voltage may decrease or increase.

In still another example, the control unit 430 may control the DC voltage of the plurality of levels based on controlling a pulse width of the DC voltage. In this example, the control unit 430 may generate a pulse-width modulation signal so that the DC voltage may be input into the PA 450 during one or more predetermined time periods. The pulse-width modulation signal may refer to a signal including pulses having different pulse widths. For example, when the pulse-width modulation signal is multiplied by the DC voltage, an operational voltage used to operate the PA 450, may be supplied to the PA 450 for a relatively long time during a time period, and for a relatively short time during another time period.

The control unit 430 transfers data in a form of a pulse signal to the modulation unit 420. The data is of a the source device and is to be transmitted to the target device. The modulation unit 420 modulates the data based on the controlled DC voltage of the plurality of levels. The controlled DC voltage may have a magnitude and/or a duration that may be changed depending on cases. In more detail, the modulation unit 420 modulates the data by mapping the data to include the magnitude and/or the duration of the controlled DC voltage. Also, the modulation unit 420 modulates the data by synthesizing the data in the form of the pulse signal received from the control unit 430 with the controlled DC voltage.

In addition, the modulation unit 420 modulates the data based on an index of a power output from the PA 450. In examples, the control unit 430 may change the index of the power output from the PA 450, by controlling a magnitude and/or a duration of a signal input into the PA 450. Also, the control unit 430 may change the index of the power output from the PA 450, by changing a magnitude and/or a duration of the operational voltage used to operate the PA 450. The modulation unit 420 modulates the data based on the index that may be changed. The index will be further described with reference to FIG. 10.

The frequency generating unit 440 generates a signal with a resonance frequency. The resonance frequency may be determined by the control unit 430. The PA 450 amplifies the input signal with the resonance frequency to a magnitude (e.g., of amplitude) corresponding to a request of the target device. The PA 450 outputs a power, using the input signal with the resonance frequency as an input signal, and the controlled DC voltage of the plurality of levels as an operational signal. The PA 450 may receive the controlled DC voltage from the conversion unit 410 and/or via the modulation unit 420. The matching network 460 matches an input impedance of the target device and an impedance output from the PA 450.

Figure 5:
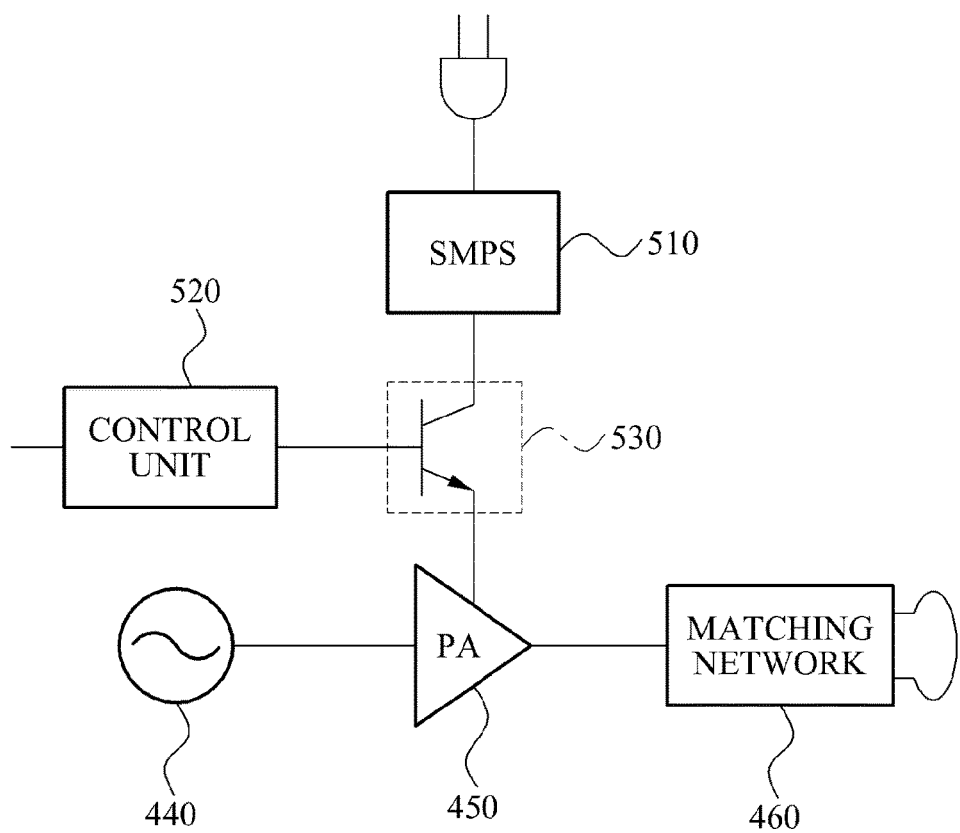
FIG. 5 is a diagram illustrating another detailed example of a communication apparatus using a wireless power.

FIG. 5 illustrates another detailed example of a communication apparatus using a wireless power. The communication apparatus may be implemented in the source device 110 of FIG. 1. Referring to FIG. 5, the communication apparatus includes an SMPS 510, a control unit 520, and a transistor 530, along with the frequency generating unit 440, the PA 450, and the matching network 460 of FIG. 4.

The SMPS 510 converts an AC voltage to a DC voltage, using a switching pulse signal. The AC voltage may be supplied from, for example, an external power supply.

The control unit 520 controls a voltage output from the transistor 530. For example, the control unit 520 may control the voltage output from the transistor 530 by controlling a voltage that is input into the transistor 530, using one of the examples described with reference to FIG. 4. In another example, the control unit 520 may control the voltage output from the transistor 530 based on a difference between a voltage that is input from the control unit 520 into the transistor 530 and a voltage that is input from the SMPS 510 into the transistor 530. The voltage output from the transistor 530 is a voltage supplied to the PA 450. Data of the source device to be transmitted to a target device, is modulated based on an operational voltage of various levels that is input into the PA 450 (e.g., the voltage supplied to the PA 450) and that is controlled by the control unit 520.

Figure 6:
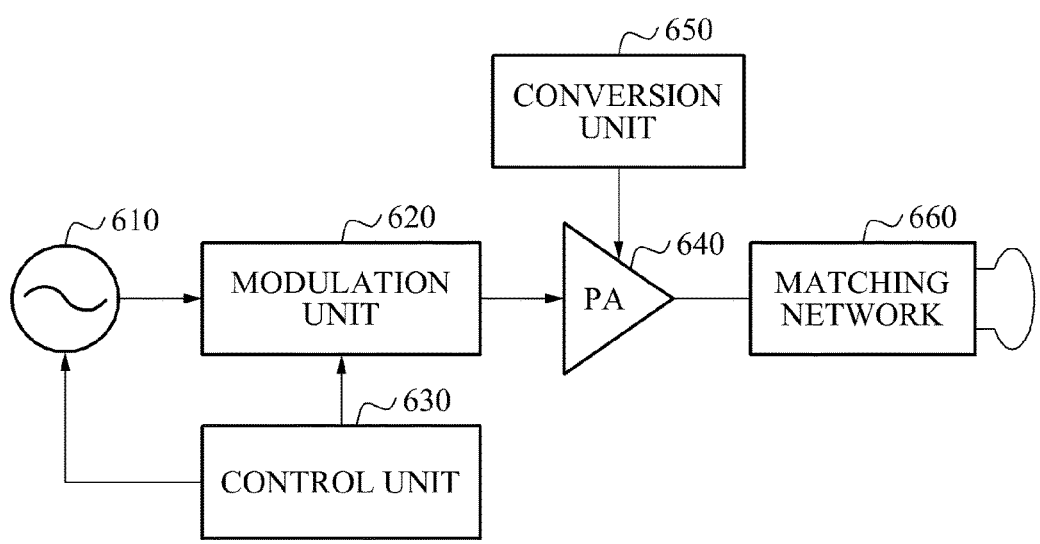
FIG. 6 is a diagram illustrating still another example of a communication apparatus using a wireless power.

FIG. 6 illustrates still another example of a communication apparatus using a wireless power. The communication apparatus may be implemented in the source device 110 of FIG. 1. Referring to FIG. 6, the communication apparatus includes a frequency generating unit 610, a modulation unit 620, a control unit 630, a PA 640, a conversion unit 650, and a matching network 660.

The frequency generating unit 610 generates a signal with a resonance frequency. The resonance frequency may be determined by the control unit 630. The PA 640 amplifies the input signal with the resonance frequency to a magnitude (e.g., of amplitude) corresponding to a request of a target device. The PA 640 outputs a power, using the input signal with the resonance frequency as an input signal, and a signal output from the conversion unit 650 as an operational signal. The matching network 660 matches an input impedance of the target device and an impedance output from the PA 640.

The conversion unit 650 converts an AC voltage to a DC voltage of a plurality of levels, using a switching pulse signal. The AC voltage may be supplied from, for example, an external power supply.

The control unit 630 provides, to the modulation unit 620, a pulse signal that is synthesized with the resonance frequency. The control unit 630 controls a duration and/or a magnitude (e.g., of amplitude) of the pulse signal.

In an example, the control unit 630 may generate a digital control signal and convert the digital control signal to an analog control signal, and may control the pulse signal based on the analog control signal. The control unit 630 may include a D/A converter (not shown). The D/A converter may convert the digital control signal to the analog control signal. The control unit 630 may control the magnitude of the pulse signal based on the analog control signal.

In another example, the control unit 630 may control the pulse signal based on controlling a pulse width of the pulse signal. In this example, the control unit 630 may generate a pulse width modulation signal so that the pulse signal may be input into the PA 640 during one or more predetermined time periods. The pulse width modulation signal may refer to a signal including pulses having different pulse widths. For example, when the pulse signal with the resonance frequency is multiplied by the pulse width modulation signal, an input voltage may be supplied to the PA 640 for a relatively long time during a time period, and for a relatively short time during another time period.

The modulation unit 620 modulates data by synthesizing the input signal and the pulse signal. The data is of the source device and is to be transmitted to the target device. The pulse signal may have a magnitude and/or a duration that may be changed depending on cases. Also, the modulation unit 620 modulates the data by mapping the data to include the magnitude and/or the duration of the pulse signal.

Figure 7:
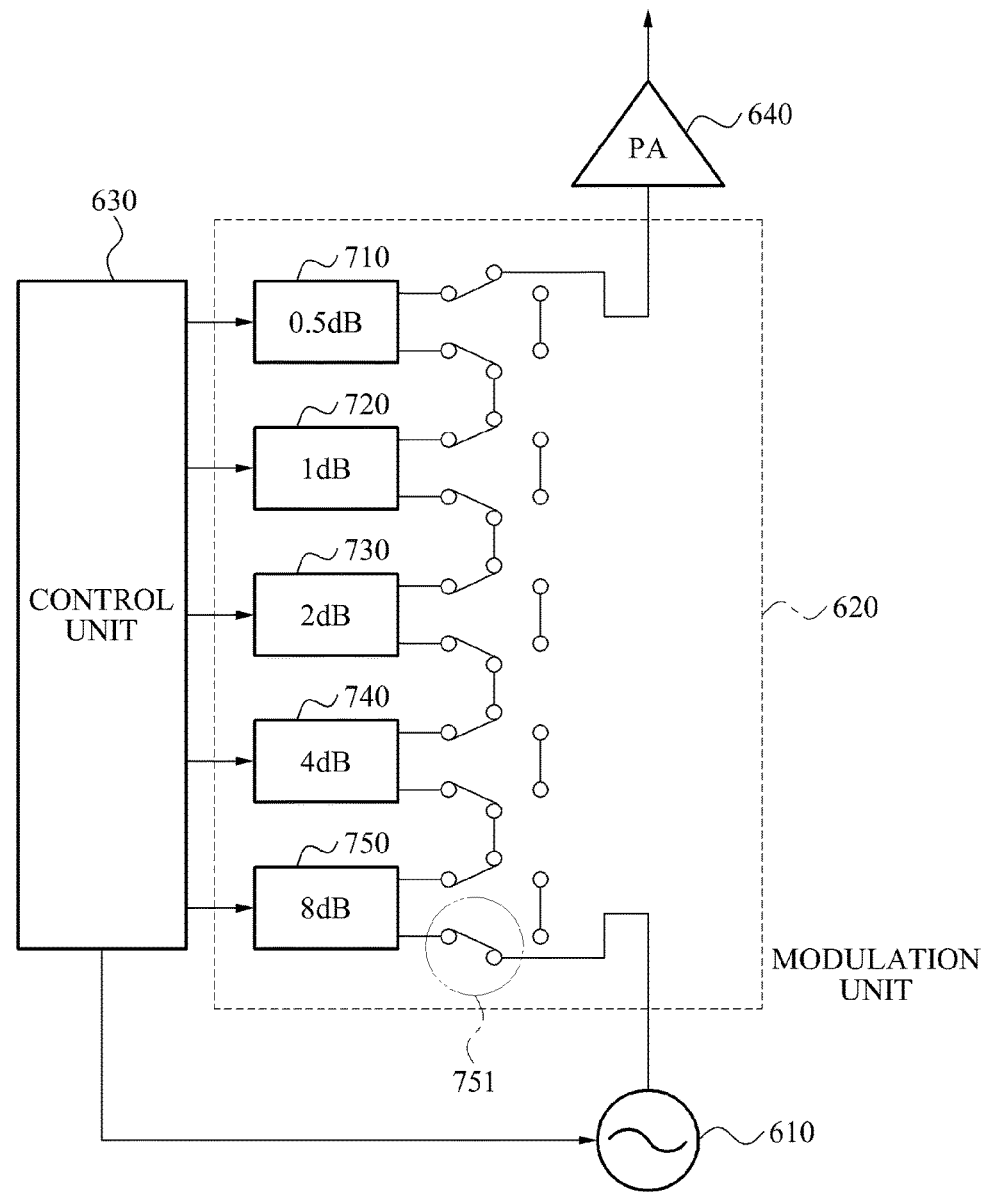
FIG. 7 is a diagram illustrating an example of a modulation unit.

FIG. 7 illustrates a example of the modulation unit 620 of FIG. 6. Referring to FIG. 7, the modulation unit 620 includes a plurality of attenuators, for example, an attenuator 710, an attenuator 720, an attenuator 730, an attenuator 740, and an attenuator 750. In this example, the attenuator 710 may reduce a magnitude (e.g., of amplitude) of an input signal generated by the frequency generating unit 610 by 0.5 decibels (dB). The attenuator 720 may reduce the magnitude of the input signal by 1 dB. The attenuator 730 may reduce the magnitude of the input signal by 2 dB. The attenuator 740 may reduce the magnitude of the input signal by 4 dB. The attenuator 750 may reduce the magnitude of the input signal by 8 dB.

The modulation unit 620 controls electrical connections between the attenuators 710 through 750 and the frequency generating unit 610, using switches. For example, the modulation unit 620 may control a switch 751 to connect the attenuators 710 through 750 with the frequency generating unit 610 to reduce the magnitude of the input signal by a sum total of 15.5 dB. The modulation unit 620 modulates data by attenuating the input signal by a predetermined magnitude, using the attenuators 710 through 750.

Figure 8:
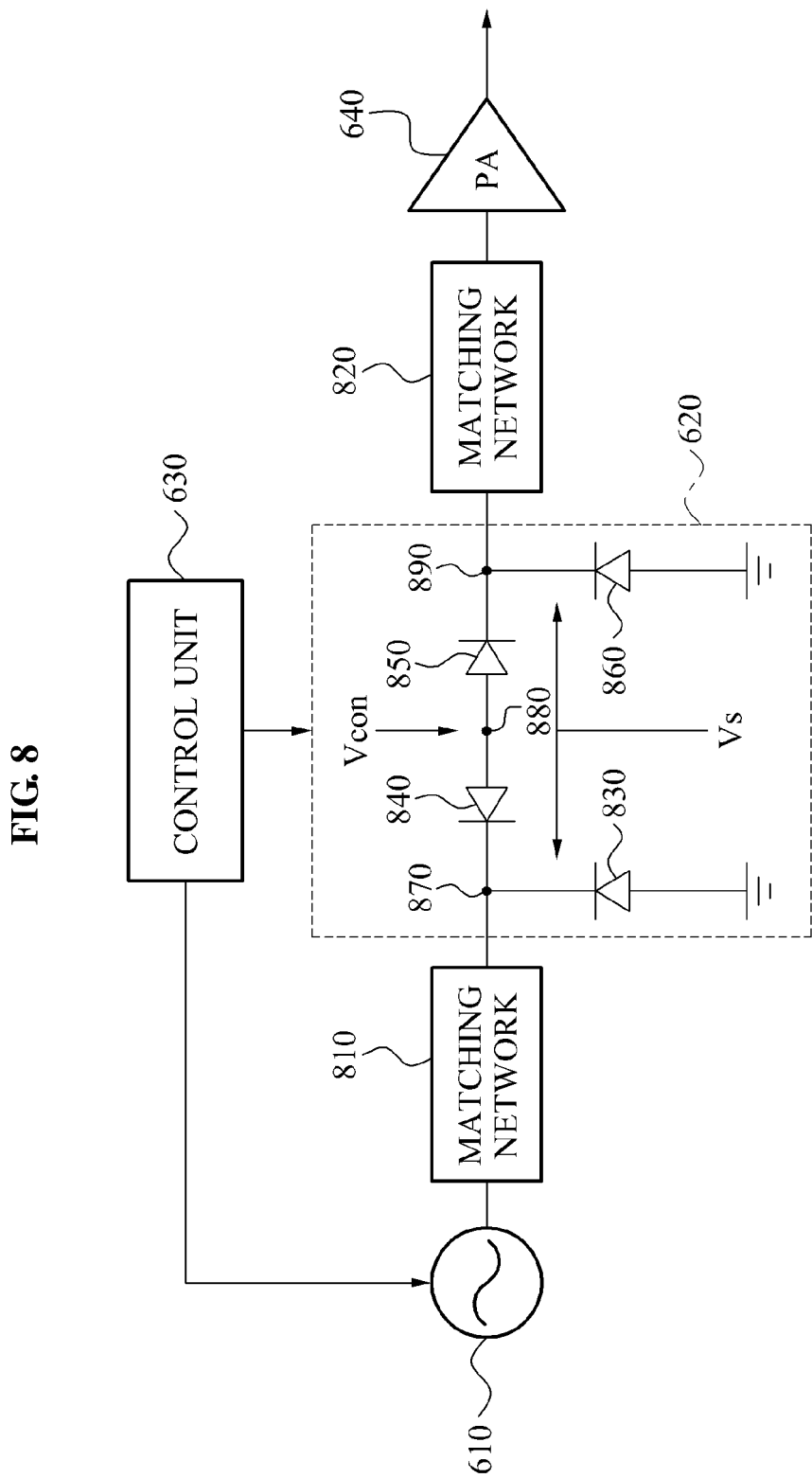
FIG. 8 is a diagram illustrating another example of a modulation unit.

FIG. 8 illustrates another example of the modulation unit 620 of FIG. 6. Referring to FIG. 8, the modulation unit 620 includes a plurality of diodes, for example, a diode 830, a diode 840, a diode 850, and a diode 860. The modulation unit 620 increases or decreases a magnitude of an input signal generated by the frequency generating unit 610 based on a difference between a voltage Vs applied to the diode 830 and the diode 860 and a voltage Vcon applied to a position 880 between the diode 840 and the diode 850.

In more detail, when the voltage Vs at a position 870 is greater than the voltage Vcon at the position 880, a reverse bias is applied to the diode 840. When the voltage Vs at a position 890 is greater than the voltage Vcon at the position 880, a reverse bias is applied to the diode 850. Thus, in this case, the diode 840 and the diode 850 operate like capacitors. When the voltage Vcon at the position 880 is greater than the voltage Vs at the position 870, a forward bias is applied to the diode 840. When the voltage Vcon at the position 880 is greater than the voltage Vs at the position 890, a forward bias is applied to the diode 850. Thus, in this case, the diode 840 and the diode 850 operate like resistors. The resistors may be referred to as forward resistors.

The control unit 630 controls the voltage Vcon to enable a forward bias to be applied to the diode 840 and the diode 850. A value of a forward resistor is variable based on a magnitude of the controlled voltage Vcon. The modulation unit 620 modulates data, using the variable forward resistors. That is, the modulation unit 620 increases or decreases the magnitude of the input signal generated by the frequency generating unit 610 using the variable forward resistors.

The matching network 810 matches an input impedance of the modulation unit 620 and an impedance output from the frequency generating unit 610. The matching network 820 matches an input impedance of the target device and an impedance output from the modulation unit 620.

Figure 9:
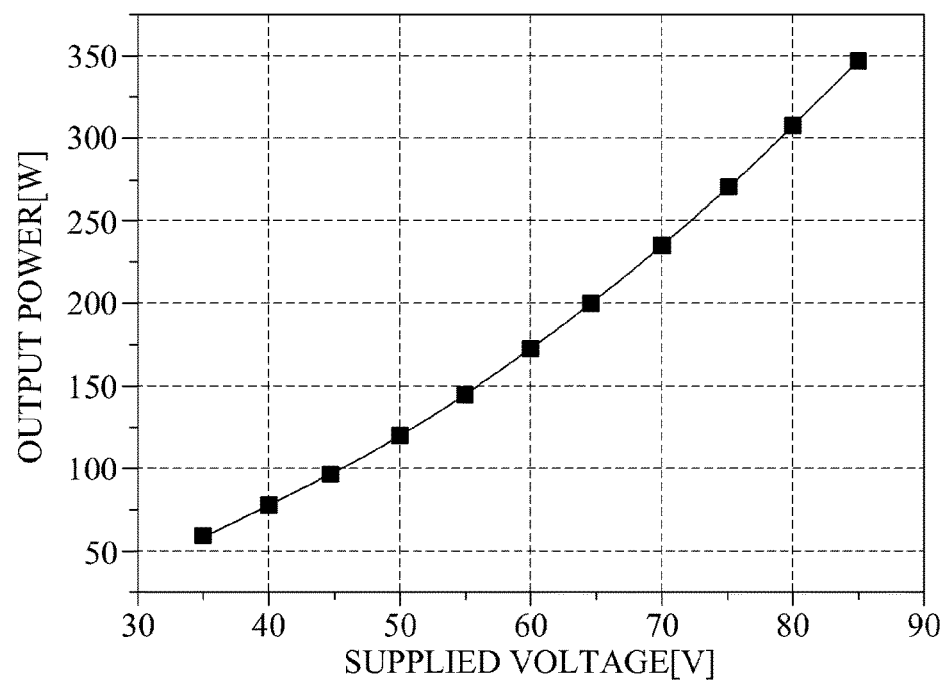
FIG. 9 is a graph illustrating an example of a relationship between a voltage that is supplied to a power amplifier and a power that is output from the power amplifier.

FIG. 9 illustrates an example of a relationship between a voltage that is supplied to a power amplifier and a power that is output from the power amplifier. The power output from the PA increases as the voltage supplied to the PA increases. The voltage supplied to the PA may be an operational voltage of the PA or may be a voltage input into the PA. Since the output power is proportional to the supplied voltage, a communication apparatus using a wireless power may demodulate a message received from a target device based on a change in the supplied voltage, and may modulate a message of a source device by changing the supplied voltage.

When an impedance of the target device is changed, the power output from the PA may be changed. In this example, since the voltage supplied to the PA may need to be changed in order to change the power from the PA, the communication apparatus may demodulate a message received from the target device based on a change in an amount the supplied voltage corresponding to load modulation. Also, the communication apparatus may modulate a message of the source device by changing a magnitude and/or a duration of the supplied voltage. The output power output may be changed based on the change in the supplied voltage, and the target device may demodulate the message of the source device based on the change in an amount of the output power.

Figure 10:
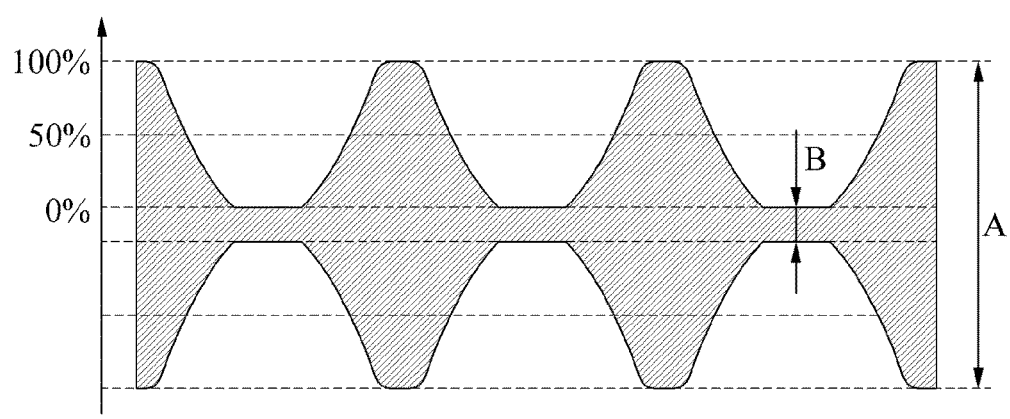
FIG. 10 is a diagram illustrating an example of a modulating process using a power that is output from a power amplifier.

FIG. 10 illustrates an example of a modulating process using a power that is output from a power amplifier. Line A indicates a maximum amplitude of the output power, and line B indicates a minimum amplitude of the output power. An index of the output power may be a percentage of a quotient of a difference between the maximum amplitude and the minimum amplitude, and a sum of the maximum amplitude and the minimum amplitude, as expressed by Equation 1.

$$\text{Index} = \frac{A-B}{A+B} \times 100\% \qquad \text{[Equation 1]}$$

A communication apparatus using a wireless power may modulate data based on the index of the output power. Since the index may be determined based on the maximum amplitude and the minimum amplitude of the output power, the communication apparatus may modulate data by adjusting the maximum amplitude and the minimum amplitude of the output power. The maximum amplitude and the minimum amplitude of the output power may be determined based on a voltage that may be input or supplied to the PA. In more detail, the communication apparatus may adjust the maximum amplitude and the minimum amplitude of the output power based on a magnitude and/or a duration of the input voltage or the supplied voltage.

Figure 11:
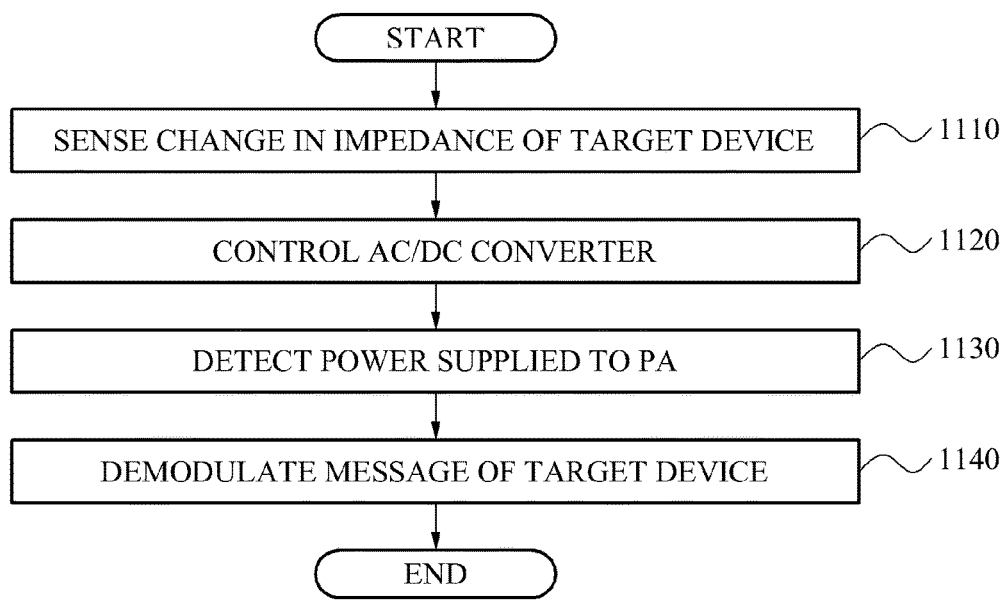
FIG. 11 is a flowchart illustrating an example of a communication method using a wireless power.

FIG. 11 illustrates an example of a communication method using a wireless power. At step 1110, a source device senses a change in an impedance of a target device. For example, the source device may sense the change in the impedance of the target device through matching networks of the source device and the target device being improperly matched or being mismatched.

At step 1120, the source device controls an AC/DC converter based on the change in the impedance of the target device. In more detail, the source device controls a power that is output from the AC/DC converter to be a power corresponding to a request of the target device. The power output from the AC/DC converter is provided to a PA as a power supplied to the PA.

At step 1130, the source device detects the power supplied to the PA that is output from the AC/DC converter and is input into the PA. In examples, the source device may detect a voltage or a current supplied to the PA. The source device may detect the supplied power based on detecting a voltage applied to both ends of a resistor. Also, the source device may detect the supplied power based on detecting a voltage applied to both ends of an ON-resistance ($R_{on}$) of a transistor. Further, the source device may detect the supplied power based on detecting a voltage applied to both ends of a line impedance.

At step 1140, the source device demodulates a message received from the target device based on a change in an amount of the detected supplied power. Since the supplied power may be changed based on the change in the impedance of the target device, the source device may demodulate the message by comparing the change in the amount (e.g., a signal) of the detected supplied power to a predetermined reference signal.

In more detail, the source device amplifies the detected supplied power to be greater than a predetermined value. The source device compares the detected supplied power to the predetermined reference signal to output a HIGH value or a LOW value of the detected supplied power. The source device demodulates the message received from the target device based on the output HIGH value or the output LOW value.

Figure 12:
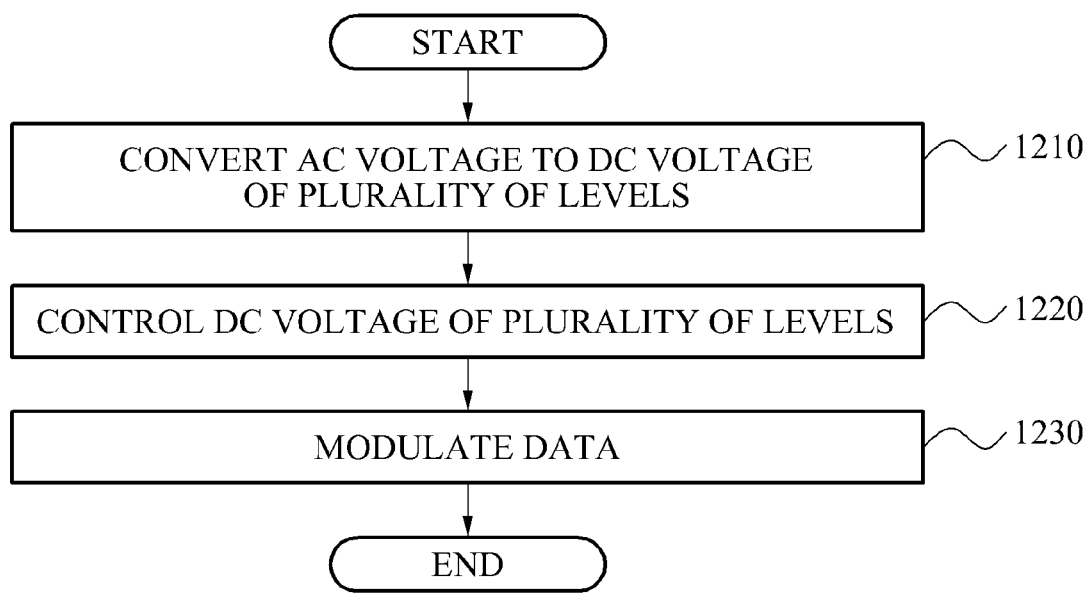
FIG. 12 is a flowchart illustrating another example of a communication method using a wireless power.

FIG. 12 illustrates another example of a communication method using a wireless power. At step 1210, a source device converts an AC voltage to a DC voltage of a plurality of levels, using a switching pulse signal.

At step 1220, the source device controls the DC voltage of the plurality of levels to be supplied to a PA. In examples, the source device may control a magnitude and/or a duration of the DC voltage. The source device may generate a digital control signal and may convert the digital control signal to an analog control signal, and may control the DC voltage based on the analog control signal. The source device may control the DC voltage by controlling a pulse width of the DC voltage.

At step 1230, the source device modulates data based on the controlled DC voltage of the plurality of levels. In examples, the source device may modulate the data by mapping the data to the magnitude and/or the duration of the DC voltage of the plurality of levels. The source device may modulate the data based on an index of a power that may be output from the PA.

Figure 13:
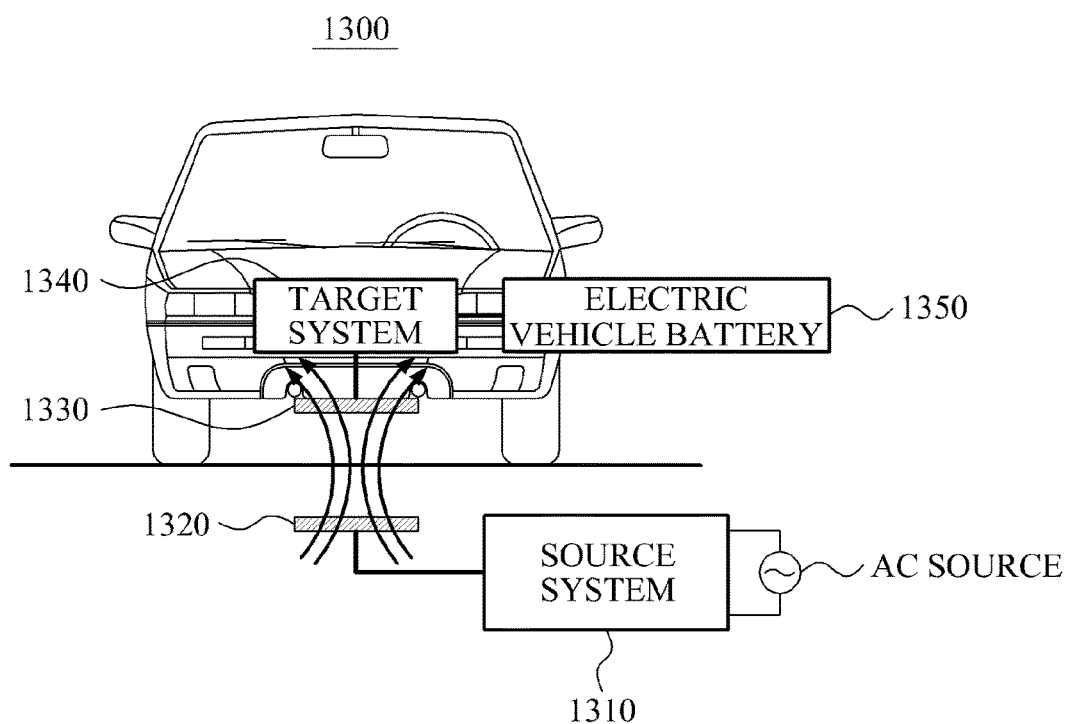
FIG. 13 is a diagram illustrating an example of an electric vehicle charging system.

FIG. 13 illustrates an example of an electric vehicle charging system 1300. The electric vehicle charging system 1300 includes a source system 1310, a source resonator 1320, a target resonator 1330, a target system 1340, and an electric vehicle battery 1350.

The electric vehicle charging system 1300 may have a similar structure to the wireless power transmission system of FIG. 1. The source system 1310 and the source resonator 1320 in the electric vehicle charging system 1300 may function as a source device. Additionally, the target resonator 1330 and the target system 1340 in the electric vehicle charging system 1300 may function as a target device.

The source system 1310 may include, for example, an AC/DC converter, a power detector, a power converter, a control/communication unit, similarly to the source device 110 of FIG. 1. The target system 1340 may include, for example, a rectification unit, a DC/DC converter, a switch unit, a charging unit, and a control/communication unit, similarly to the target device 120 of FIG. 1.

The source system 1310 generates power based on a type of an electric vehicle, a capacity of the electric vehicle battery 1350, and/or a charging state of the electric vehicle battery 1350. The source system 1310, via the source resonator 1320, may supply the generated power, via the target resonator 1330, to the target system 1340. The target system 1340 charges the electric vehicle battery 1350. The electric vehicle charging system 1300 may use a resonance frequency in a band of a few kilohertz (KHz) to tens of MHz.

The source system 1310 controls the source resonator 1320 and the target resonator 1330 to be aligned. For example, when the source resonator 1320 and the target resonator 1330 are not aligned, a controller of the source system 1310 may transmit a message to the target system 1340, and may control alignment between the source resonator 1320 and the target resonator 1330.

For example, when the target resonator 1330 is not located in a position enabling maximum magnetic resonance, the source resonator 1320 and the target resonator 1330 may not be aligned. When the electric vehicle vehicle does not stop accurately, the source system 1310 may induce a position of the electric vehicle to be adjusted, and may control the source resonator 1320 and the target resonator 1330 to be aligned.

The source system 1310 and the target system 1340 may transmit or receive an ID of the electric vehicle, and/or may exchange various messages through communication. The descriptions of FIGS. 2 through 12 may be applied to the electric vehicle charging system 1300. However, the electric vehicle charging system 1300 may use a resonance frequency in a band of a few KHz to tens of MHz, and may transmit power that is equal to or higher than tens of watts to charge the electric vehicle battery 1350.

FIGS. 14A through 15B illustrate examples of applications in which a wireless power receiver and a wireless power transmitter may be mounted.

Figure 14A:
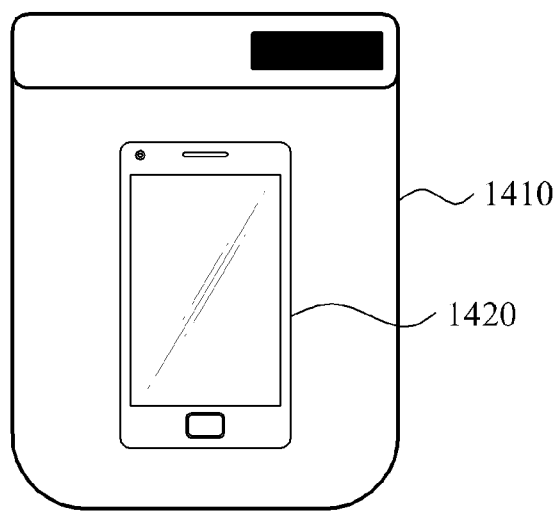
FIGS. 14A through 15B are diagrams illustrating examples of applications in which a wireless power receiver and a wireless power transmitter may be mounted.
Figure 14B:
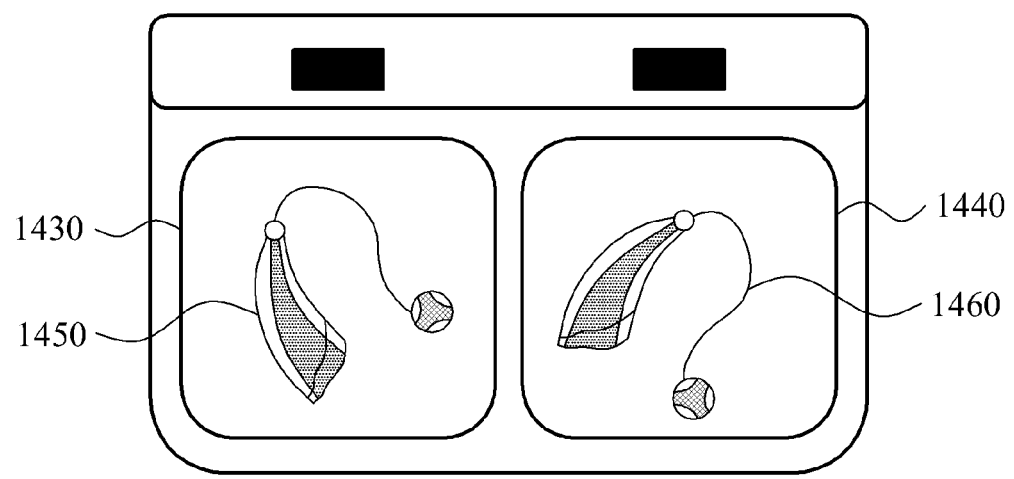

FIG. 14A illustrates an example of wireless power charging between a pad 1410 and a mobile terminal 1420, and FIG. 14B illustrates an example of wireless power charging between pads 1430 and 1440 and hearing aids 1450 and 1460.

In an example, a wireless power transmitter may be mounted in the pad 1410, and a wireless power receiver may be mounted in the mobile terminal 1420. The pad 1410 may be used to charge a single mobile terminal, namely the mobile terminal 1420.

In another example, two wireless power transmitters may be respectively mounted in the pads 1430 and 1440. The hearing aids 1450 and 1460 may be used for a left ear and a right ear, respectively. In this example, two wireless power receivers may be respectively mounted in the hearing aids 1450 and 1460.

Figure 15A:
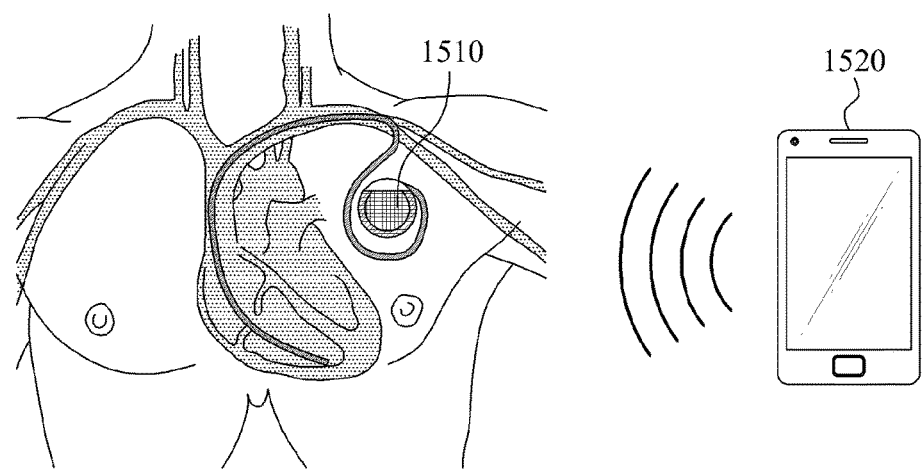
Figure 15B:
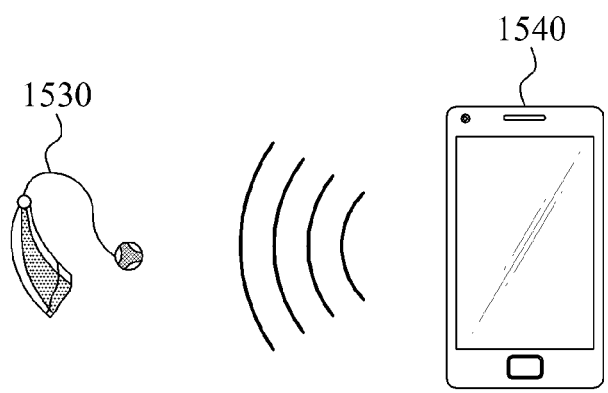

FIG. 15A illustrates an example of wireless power charging between an electronic device 1510 that is inserted into a human body, and a mobile terminal 1520. FIG. 15B illustrates an example of wireless power charging between a hearing aid 1530 and a mobile terminal 1540.

In an example, a wireless power transmitter and a wireless power receiver may be mounted in the mobile terminal 1520. In this example, another wireless power receiver may be mounted in the electronic device 1510. The electronic device 1510 may be charged by receiving power from the mobile terminal 1520.

In another example, a wireless power transmitter and a wireless power receiver may be mounted in the mobile terminal 1540. In this example, another wireless power receiver may be mounted in the hearing aid 1530. The hearing aid 1530 may be charged by receiving power from the mobile terminal 1540. Low-power electronic devices, for example Bluetooth earphones, may also be charged by receiving power from the mobile terminal 1540.

Figure 16:
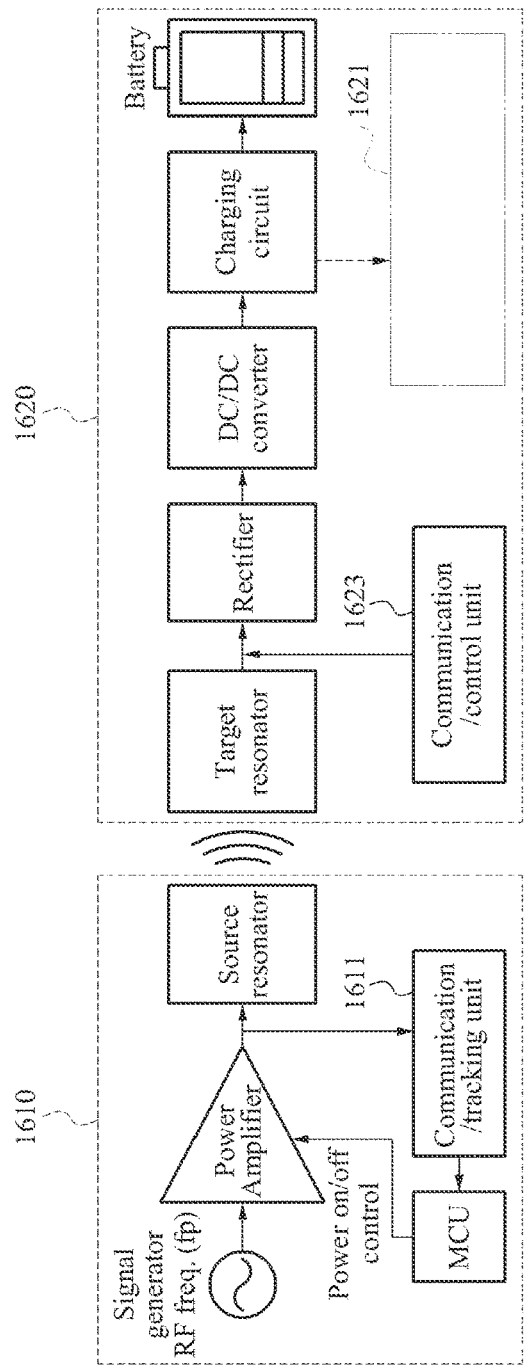
FIG. 16 is a diagram illustrating an example of a wireless power transmitter and a wireless power receiver.

FIG. 16 illustrates an example of a wireless power transmitter and a wireless power receiver.

In FIG. 16, a wireless power transmitter 1610 may be mounted in each of the pads 1430 and 1440 of FIG. 14B. Additionally, the wireless power transmitter 1610 may be mounted in the mobile terminal 1540 of FIG. 15B.

In addition, a wireless power receiver 1620 may be mounted in each of the hearing aids 1450 and 1460 of FIG. 14B.

The wireless power transmitter 1610 may have a similar configuration to the source device 110 of FIG. 1. For example, the wireless power transmitter 1610 may include a unit configured to transmit power using magnetic coupling.

As illustrated in FIG. 16, the wireless power transmitter 1610 includes a communication/tracking unit 1611. The communication/tracking unit 1611 may communicate with the wireless power receiver 1620, and may control an impedance and a resonant frequency to maintain a wireless power transmission efficiency. Additionally, the communication/tracking unit 1611 may perform similar functions to the power converter 114 and the control/communication unit 115 of FIG. 1.

The wireless power receiver 1620 may have a similar configuration to the target device 120 of FIG. 1. For example, the wireless power receiver 1620 may include a unit configured to wirelessly receive power and to charge a battery. As illustrated in FIG. 16, the wireless power receiver 1620 includes a target resonator, a rectifier, a DC/DC converter, and a charging circuit. Additionally, the wireless power receiver 1620 may include a control/communication unit 1623.

The communication/control unit 1623 may communicate with the wireless power transmitter 1610, and may perform an operation to protect overvoltage and overcurrent.

The wireless power receiver 1620 may include a hearing device circuit 1621. The hearing device circuit 1621 may be charged by the battery. The hearing device circuit 1621 may include a microphone, an analog-to-digital converter (ADC), a processor, a digital-to-analog converter (DAC), and a receiver. For example, the hearing device circuit 1621 may have the same configuration as a hearing aid.

According to the teachings above, there is provided an apparatus and method in which a modulated message received from a target device may be restored or demodulated more stably, using an operational voltage of a power amplifier. Also, data may be restored stably without frequency interference, based on a change in an amount of power supplied to the power amplifier, at a resonance frequency identical to a frequency at which a power may be transmitted. Further, problems of a DC offset, a leakage current, and/or other types of problems may be resolved, and a Bit Error Rate (BER) in communication may be improved, by performing modulation and demodulation using a voltage or a current supplied to the power amplifier.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums. The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments for accomplishing the examples disclosed herein can be easily construed by programmers skilled in the art to which the examples pertain based on and using the flow diagrams and block diagrams of the figures and their corresponding descriptions as provided herein.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus using a wireless power, comprising:
an amplifier configured to amplify an input signal based on a power supplied to the amplifier;
a load element coupled to the amplifier; and
a controller configured to
measure a voltage applied to the load element,
detect a change in the power caused by a change in an impedance of a target device based on the measured voltage, and
demodulate a message from the target device based on the detected change,
wherein the load element comprises a resistor, or an ON-resistance of a transistor, or a line impedance, or any combination thereof.

2. The apparatus of claim 1, wherein the controller comprises:
an amplification unit configured to amplify the power to be greater than a predetermined value.

3. The apparatus of claim 1, wherein the controller comprises:
a ripple signal removing unit configured to remove a ripple signal comprised in the power.

4. The apparatus of claim 1, wherein:
the controller comprises a comparison unit configured to compare the changed power to a predetermined reference signal, and to determine a HIGH value or a LOW value of the changed power based on a result of the comparison; and
the controller is further configured to demodulate the message based on the HIGH value or the LOW value.

5. An apparatus using a wireless power, comprising:
a converter configured to receive an alternating current (AC) voltage, and convert the AC voltage to a direct current (DC) voltage of a plurality of levels;

a controller configured to control the DC voltage of a plurality of levels, and modulate data based on the controlled DC voltage; and an amplifier configured to amplify an input signal based on the controlled DC voltage.

6. The apparatus of claim 5, wherein:

the controller is further configured to modulate the data based on an index of an output power from the amplifier.

7. The apparatus of claim 5, wherein the controller is further configured to generate a digital control signal, to convert the digital control signal to an analog control signal, and to control the DC voltage based on the analog control signal.

8. The apparatus of claim 5, wherein the controller is further configured to control a pulse width of the DC voltage.

9. The apparatus of claim 5, wherein:

the amplifier is further configured to receive the input signal as an input voltage and receive the controlled DC voltage as an operational voltage; and the controller is further configured to control a magnitude of the input voltage or a magnitude of the operational voltage.

10. A communication method of a wireless power transmitter, comprising:

measuring a voltage supplied to the amplifier using a load element coupled to the amplifier;

detecting a change in the power caused by a change in an impedance of a target device based on the measured voltage;

demodulating a message received from the target device based on the detected change, wherein the load element comprises a resistor, or an ON-resistance of a transistor, or a line impedance, or any combination thereof.

11. The method of claim 10, wherein the demodulating comprises amplifying the power to be greater than a predetermined value.

12. The method of claim 10, wherein the demodulating comprises:

comparing the power to a predetermined level;

determining a HIGH value or a LOW value of the power based on a result of the comparing; and demodulating the message based on the HIGH value or the LOW value.

13. A communication method of a wireless power transmitter, comprising:

converting an alternating current (AC) voltage to a direct current (DC) voltage of a plurality of levels;

controlling the DC voltage of the plurality of levels;

modulating data based on the controlled DC voltage; and amplifying an input signal based on the controlled DC voltage.

14. The method of claim 13, wherein the modulating comprises modulating the data based on an index of a output power from an amplifier.

15. The method of claim 13, wherein the controlling comprises:

generating a digital control signal;

converting the digital control signal to an analog control signal; and controlling the DC voltage based on the analog control signal.

16. The method of claim 13, wherein the controlling comprises controlling a pulse width of the DC voltage.

* * * * *